United States Patent
Reed et al.

(10) Patent No.: US 8,187,555 B2
(45) Date of Patent: May 29, 2012

(54) SYSTEM FOR CADMIUM TELLURIDE (CDTE) RECLAMATION IN A VAPOR DEPOSITION CONVEYOR ASSEMBLY

(75) Inventors: Max William Reed, Niwot, CO (US); Mark Jeffrey Pavol, Arvada, CO (US); Christopher Rathweg, Louisville, CO (US)

(73) Assignee: PrimeStar Solar, Inc., Arvada, CO (US)

( * ) Notice: Subject to any disclaimer, the term of this patent is extended or adjusted under 35 U.S.C. 154(b) by 285 days.

(21) Appl. No.: 12/638,731

(22) Filed: Dec. 15, 2009

(65) Prior Publication Data

US 2011/0142746 A1 Jun. 16, 2011

(51) Int. Cl.
*B01D 5/00* (2006.01)
(52) U.S. Cl. ...................................... 422/244; 23/294 R
(58) Field of Classification Search .................. 422/244; 23/294 R
See application file for complete search history.

(56) References Cited

U.S. PATENT DOCUMENTS

| | | | |
|---|---|---|---|
| 5,248,349 A | 9/1993 | Foote et al. | |
| 5,304,499 A | 4/1994 | Bonnet et al. | |
| 5,366,764 A | 11/1994 | Sunthankar | |
| 5,405,588 A | 4/1995 | Kronberg | |
| 5,437,705 A | 8/1995 | DeLisle et al. | |
| 5,712,187 A | 1/1998 | Li et al. | |
| 5,779,877 A | 7/1998 | Drinkard, Jr. et al. | |
| 5,897,685 A | 4/1999 | Goozner et al. | |
| 5,994,642 A | 11/1999 | Higuchi et al. | |
| 6,129,779 A | 10/2000 | Bohland et al. | |
| 6,423,565 B1 | 7/2002 | Barth et al. | |
| 6,444,043 B1 | 9/2002 | Gegenwart et al. | |
| 6,719,848 B2 | 4/2004 | Faykosh et al. | |
| 7,194,197 B1 | 3/2007 | Wendt et al. | |
| 2002/0117199 A1 | 8/2002 | Oswald | |
| 2003/0044539 A1 | 3/2003 | Oswald | |
| 2009/0194165 A1 | 8/2009 | Murphy et al. | |

FOREIGN PATENT DOCUMENTS

EP 0853345 A1 7/1998

*Primary Examiner* — Edward Johnson
(74) *Attorney, Agent, or Firm* — Dority & Manning, P.A.

(57) ABSTRACT

A conveyor assembly for use in a vapor deposition apparatus wherein a sublimed source material is deposited as a thin film on a photovoltaic (PV) module substrate. The assembly includes a conveyor movable in an endless loop path that includes an upper leg that moves in a conveyance direction to carry a substrate through a deposition area of the vapor deposition apparatus. A heat source is disposed relative to the endless loop path so as to heat the conveyor at a location generally after the point where substrates leave the conveyor. The heat source heats the conveyor to a temperature effective for sublimating source material from the conveyor. A cold trap is disposed relative to the endless loop path downstream of the heat source in a direction of movement of the conveyor and is maintained at a temperature effective for causing sublimated source material generated from heating the conveyor to plate out onto a collection member configured with the cold trap. An associated process for reclamation of source material from conveyor components is also provided.

12 Claims, 5 Drawing Sheets

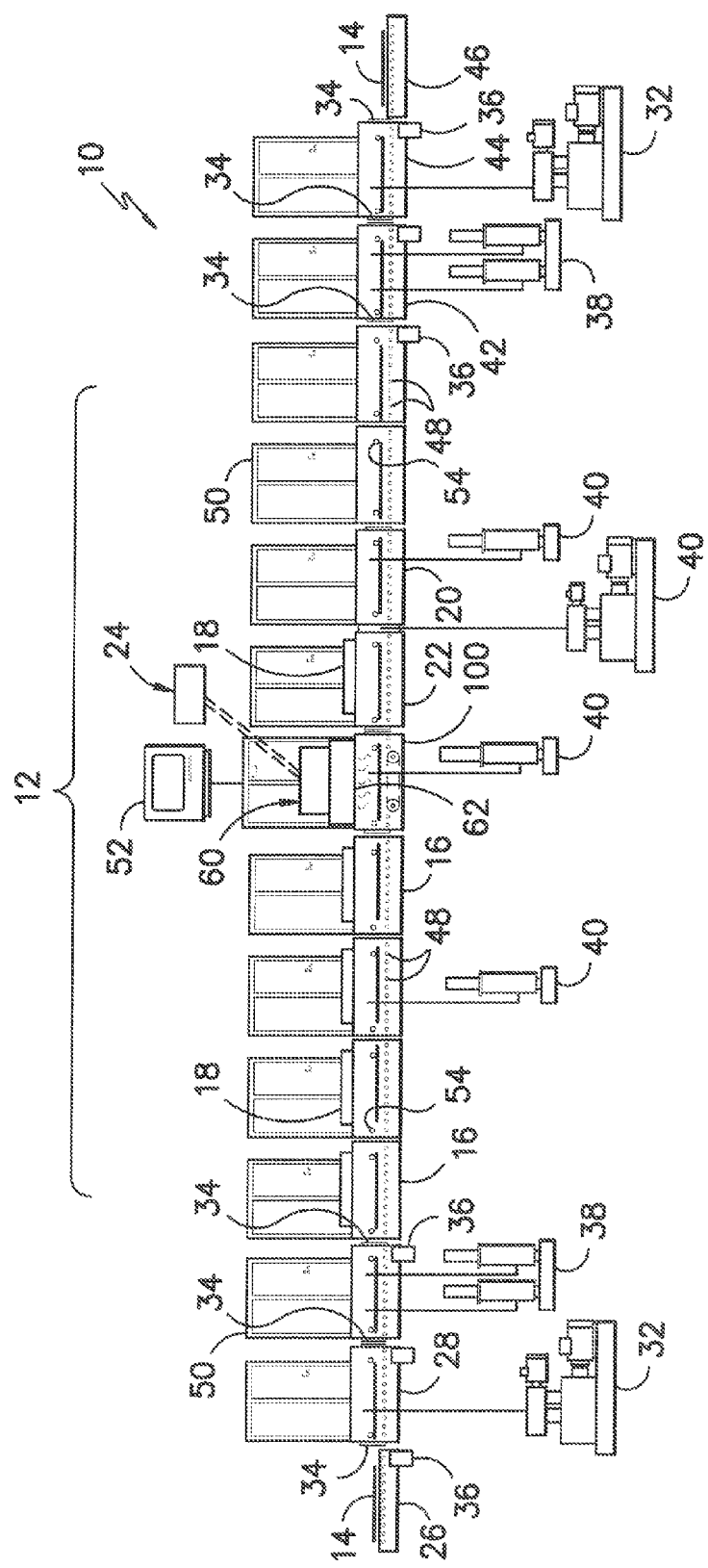
FIG. -1-

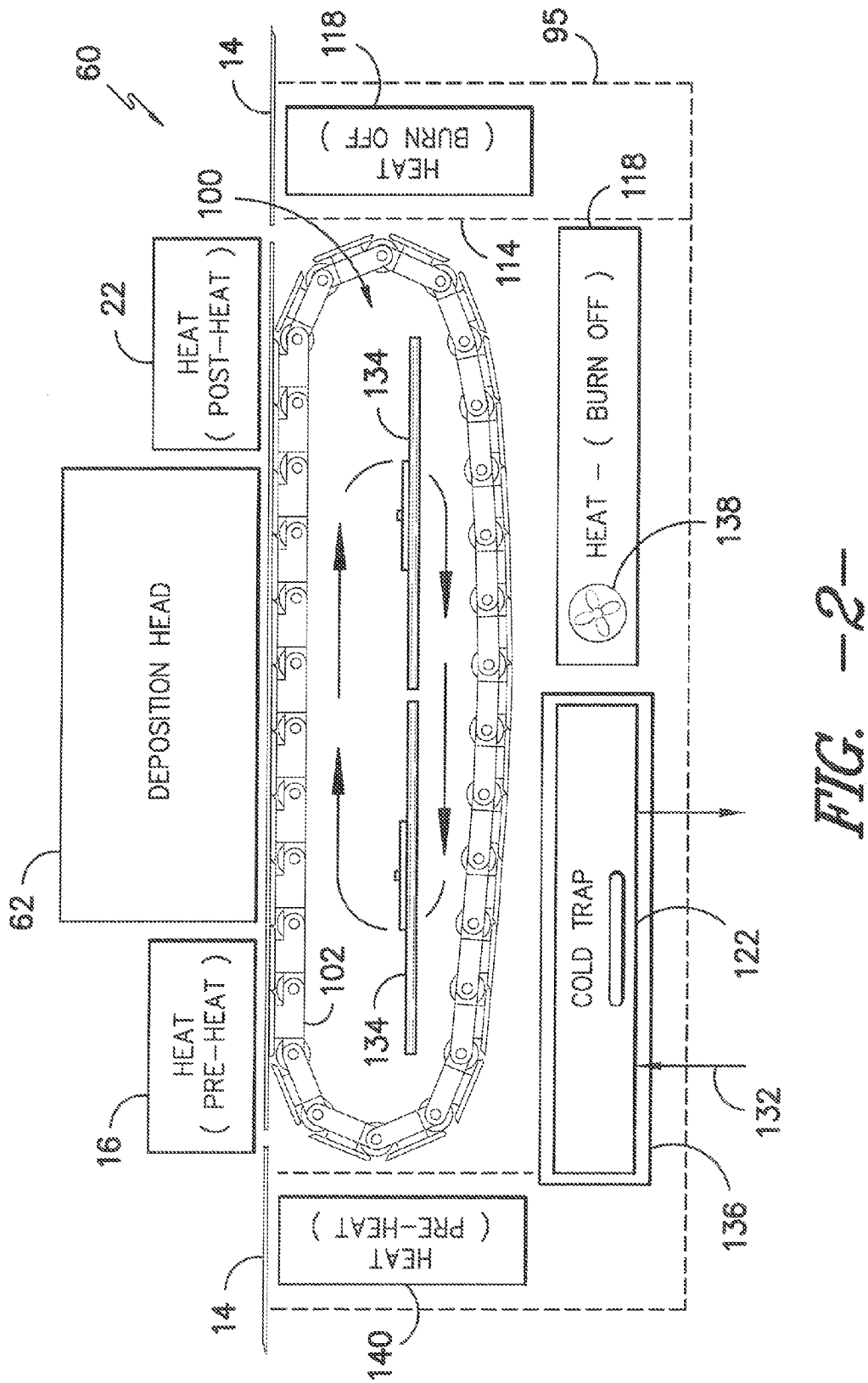
FIG. -2-

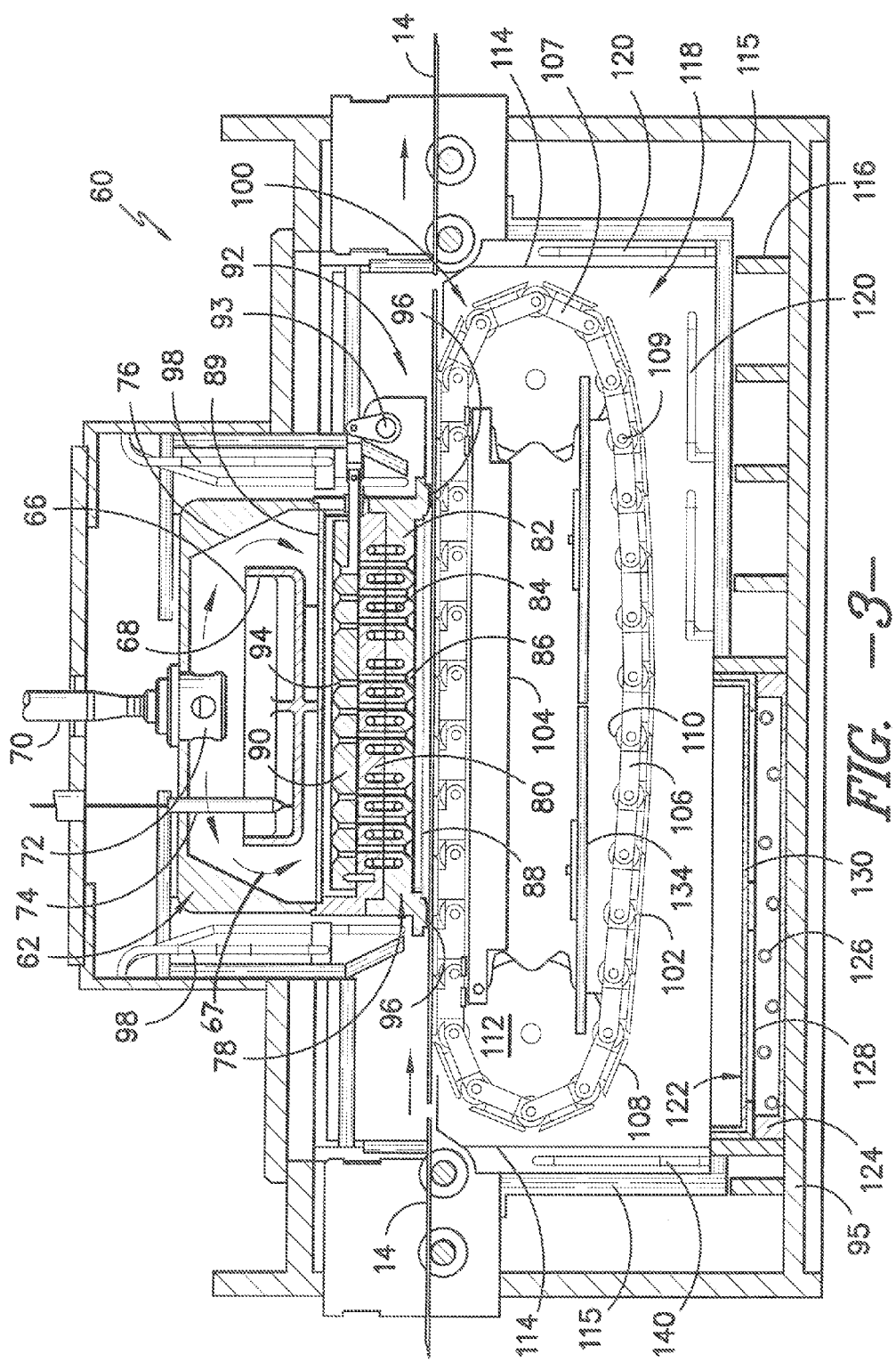
FIG. -3-

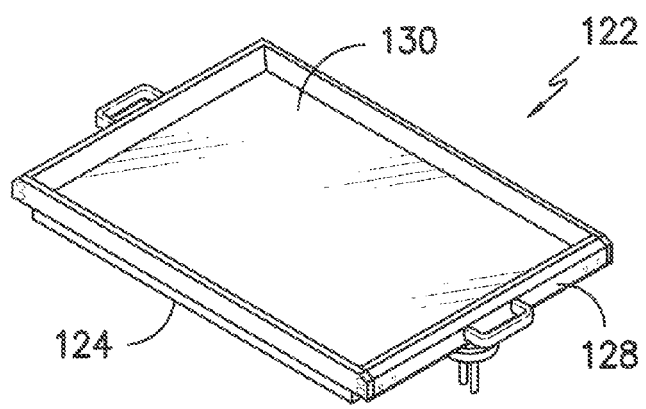
FIG. -4-
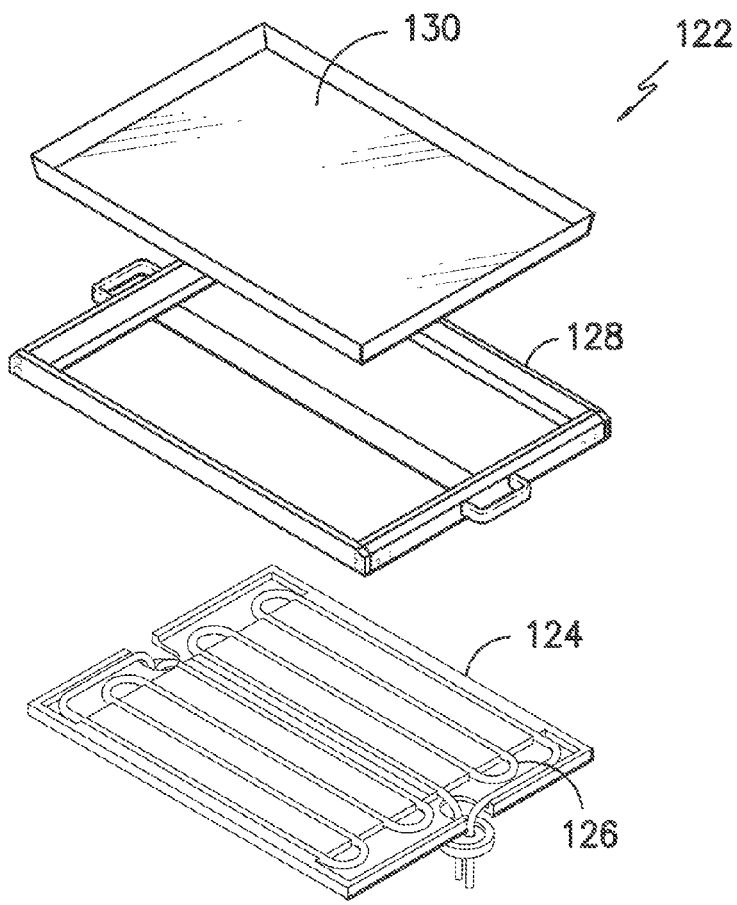
FIG. -5-

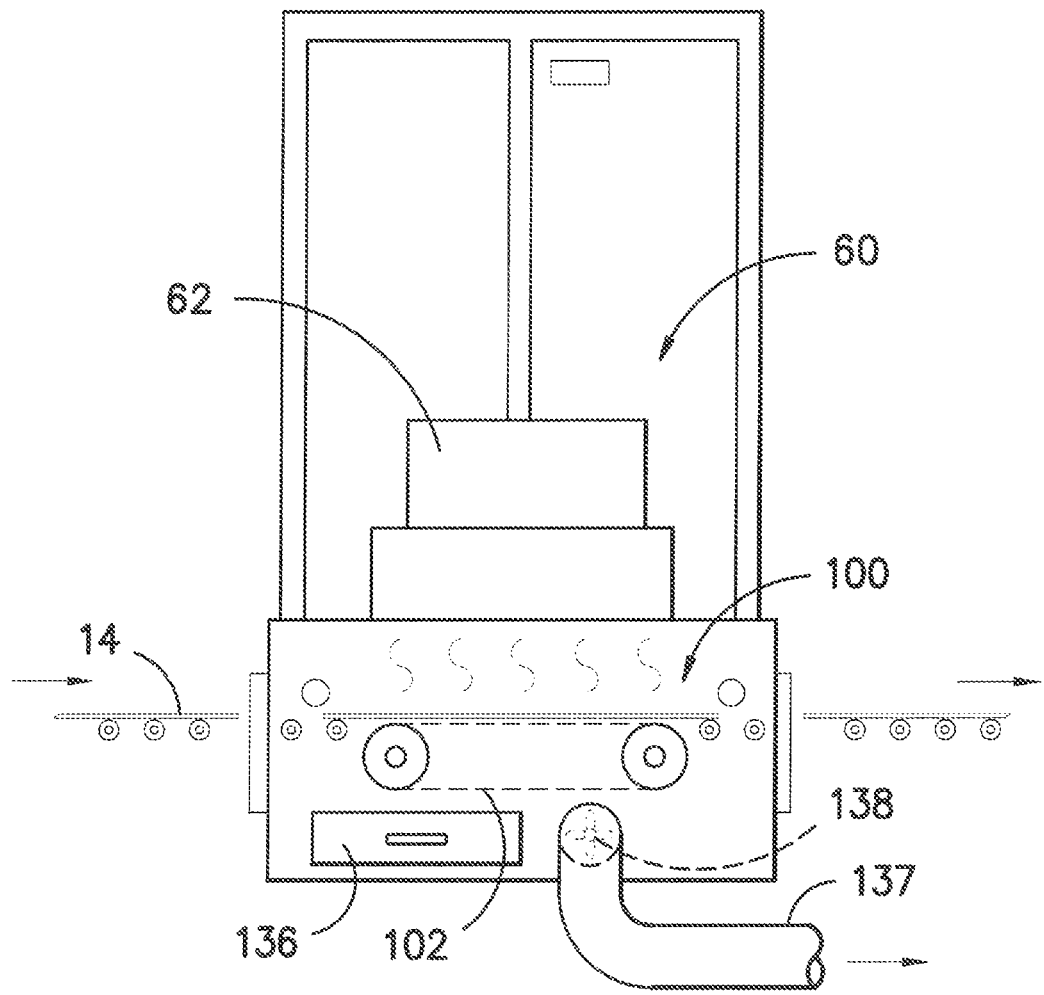
FIG. —6—

SYSTEM FOR CADMIUM TELLURIDE (CDTE) RECLAMATION IN A VAPOR DEPOSITION CONVEYOR ASSEMBLY

FIELD OF THE INVENTION

The present invention relates generally to the field of thin film deposition systems wherein a thin film layer, such as a semiconductor layer, is deposited on a substrate conveyed through the system. More particularly, the invention is related to a system and process for recovering the semiconductor material that has plated onto conveyor components used to move substrates through the vapor deposition apparatus.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. For example, CdTe has an energy bandgap of 1.45 eV, which enables it to convert more energy from the solar spectrum as compared to lower bandgap (1.1 eV) semiconductor materials historically used in solar cell applications. Also, CdTe converts energy in lower or diffuse light conditions as compared to the lower bandgap materials and, thus, has a longer effective conversion time over the course of a day or in cloudy conditions as compared to other conventional materials. Solar energy systems using CdTe PV modules are generally recognized as the most cost efficient of the commercially available systems in terms of cost per watt of power generated. However, the advantages of CdTe not withstanding, sustainable commercial exploitation and acceptance of solar power as a supplemental or primary source of industrial or residential power depends on the ability to produce efficient PV modules on a large scale and in a cost effective manner.

CdTe is a relatively expensive material, and efficient utilization of this material is a primary cost factor in the production of the PV modules. Regardless of the type of deposition system or process, some degree of the CdTe material will inevitably be "wasted" in that it is not deposited onto the PV module. For example, the material may plate out on the processing equipment, including shields, conveyor components, vessels, and the like. Recovery and recycling of this material by means that minimize down time of the processing line is a key consideration in the industry.

In addition, CdTe is considered a hazardous material, and the disposal requirements for components that contain CdTe are quite strict and add significantly to the overall cost of the PV module production. Reduction of the volume of these hazardous material components is another primary consideration.

Various references discuss systems and techniques for removal of Cd from scrap metal in general, and PV modules in particular. For example, U.S. Pat. No. 5,405,588 describes a chemical process for recovery of Cd wherein scrap materials containing the Cd are mixed with an ammonium carbonate solution to form a water-soluble ammine complex, which is then evaporated to form a second mixture of cadmium carbonate. The second mixture is further processed to recover the cadmium in the form of cadmium sulfide. U.S. Pat. No. 5,897,685, U.S. Pat. No. 5,779,877 and U.S. Pat. No. 6,129,779 all relate to chemical methods for recovering metals, such as CdTe, from scrap PV modules. U.S. Pat. No. 5,437,705 describes a process and system for recovering cadmium and nickel from Ni—Cd batteries, wherein the scrap batteries and battery components are heated in a retort oven at an effective temperature and time to vaporize the cadmium. Although these processes may have utility, they all involve removal of the components to be "cleaned" from the production lines for placement in reclamation ovens, chemical baths, and so forth, which is an undesirable consequence. In addition, the chemical processes are relatively complicated and require acids and other chemicals that are expensive, difficult to work with, and pose their own environmental hazards and disposal issues.

Accordingly, there exists a need for an improved process and system for efficient and clean recovery of CdTe from the components used in the production of PV modules without requiring shutdown of the production process. The present invention relates to a recovery system and process that serve this purpose.

BRIEF DESCRIPTION OF THE INVENTION

Aspects and advantages of the invention will be set forth in part in the following description, or may be obvious from the description, or may be learned through practice of the invention.

In accordance with aspects of the invention, a conveyor assembly is provided that is particularly suited for use in a vapor deposition apparatus wherein a sublimated source material, such as CdTe, is deposited as a thin film on a photovoltaic (PV) module substrate. The conveyor assembly is configured within the vapor deposition apparatus, and may include a housing that defines an enclosed interior volume. The conveyor assembly includes a conveyor, such as a slat conveyor, that moves in an endless loop path, which includes an upper leg that moves in a conveyance direction to carry a substrate through a deposition area of the vapor deposition apparatus. A heat source is disposed relative to the endless loop path at a location after the point where substrates leave the conveyor. The heat source is configured to heat the conveyor to a temperature effective for sublimating source material, for example CdTe, from the conveyor. A cold trap is disposed at a location along the endless loop path effective for diffusion of the sublimated source material thereto, for example downstream of the heat source in a direction of movement of the conveyor before the conveyor returns to its upper leg. The cold trap is maintained at a temperature effective for causing sublimated source material that was generated from heating the conveyor to plate out onto a collection member configured with the cold trap.

Variations and modifications to the embodiment of the conveyor assembly discussed above are within the scope and spirit of the invention and may be further described herein.

The present invention also encompasses a vapor deposition apparatus that incorporates a conveyor assembly in accordance with aspects of the invention. For example, the invention provides a vapor deposition apparatus for deposition of a sublimated source material, such as CdTe, as a thin film on a photovoltaic (PV) module substrate that is conveyed through the vapor deposition module. The apparatus includes a casing, and a vapor deposition head operably configured within the casing to sublimate a source material. A conveyor assembly is operably configured within the casing below the vapor deposition head. The conveyor assembly may be in accordance with the embodiment described above.

Variations and modifications to the embodiment of the vapor deposition apparatus discussed above are within the scope and spirit of the invention and may be further described herein.

The present invention also encompasses a process for reclamation of source material, such as CdTe, that has plated onto conveyor components in a vapor deposition apparatus wherein a sublimated source material is deposited as a thin film on photovoltaic (PV) module substrates that are conveyed through the apparatus. The process includes moving the conveyor in an endless loop path in the vapor deposition apparatus, with the endless loop path having an upper leg that moves in a conveyance direction to carry substrates through a deposition area of the apparatus. At a location along the endless loop path after where the substrates leave the conveyor in a direction of movement of the conveyor, the conveyor is heated to a temperature effective for sublimating source material from the conveyor components. The sublimated source material is collected by means of a cold trap that is disposed at an effective location along the endless loop path for diffusion of the sublimated source material thereto, for example downstream of the location where the conveyor is heated in a direction of movement of the conveyor in the endless loop path and before the conveyor returns to its upper leg. The source material that plates onto the cold trap is subsequently collected.

Variations and modifications to the embodiment of the process discussed above are within the scope and spirit of the invention and may be further described herein.

These and other features, aspects and advantages of the present invention will become better understood with reference to the following description and appended claims.

BRIEF DESCRIPTION OF THE DRAWING

A full and enabling disclosure of the present invention, including the best mode thereof, is set forth in the specification, which makes reference to the appended drawings, in which:

FIG. 1 is plan view of a vapor deposition apparatus that may incorporate features of the present invention;

FIG. 2 is a partial diagram view of a vapor deposition apparatus that includes a conveyor assembly in accordance with aspects of the invention;

FIG. 3 is a cross-sectional view of an embodiment of a vapor deposition apparatus incorporating features of the embodiment of FIG. 2;

FIG. 4 is a perspective view of an embodiment of a cold trap;

FIG. 5 is a component view of the cold trap of FIG. 4; and,

FIG. 6 is a front view of a vapor deposition apparatus that may incorporate a cold trap in accordance with aspects of the invention.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used with another embodiment to yield a still further embodiment. Thus, it is intended that the present invention encompass such modifications and variations as come within the scope of the appended claims and their equivalents.

FIG. 1 illustrates an embodiment of a vapor deposition system 10 that may incorporate a conveyor assembly 100 in accordance with aspects of the invention, particularly as a component of a vapor deposition module or apparatus 60. The system 10 is configured for deposition of a thin film layer on a photovoltaic (PV) module substrate 14 (referred to hereafter as "substrate"). The thin film may be, for example, a film layer of cadmium telluride (CdTe). It is generally recognized in the art that a "thin" film layer on a PV module substrate is generally less than about 10 microns (μm). It should be appreciated that the present conveyor assembly 100 is not limited to use in the system 10 illustrated in FIG. 1, but may be incorporated into any suitable processing line configured for vapor deposition of a thin film layer onto a substrate 14.

For reference and an understanding of an environment in which the present conveyor assembly may be used, the system 10 of FIG. 1 is described below, followed by a detailed description of an embodiment of the conveyor assembly 100.

Referring to FIG. 1, the exemplary system 10 includes a vacuum chamber 12 defined by a plurality of interconnected modules. Any combination of rough and fine vacuum pumps 40 may be configured with the modules to draw and maintain a vacuum within the chamber 12. A plurality of interconnected heater modules 16 define a pre-heat section of the vacuum chamber 12 through which the substrates 14 are conveyed and heated to a desired temperature before being conveyed into the vapor deposition apparatus 60. Each of the modules 16 may include a plurality of independently controlled heaters 18, with the heaters defining a plurality of different heat zones. A particular heat zone may include more than one heater 18.

The vacuum chamber 12 also includes a plurality of interconnected cool-down modules 20 downstream of the vapor deposition apparatus 60. The cool-down modules 20 define a section within the vacuum chamber 12 in which the substrates 14 having the thin film of sublimed source material deposited thereon are allowed to cool at a controlled cool-down rate prior to the substrates 14 being removed from the system 10. Each of the modules 20 may include a forced cooling system wherein a cooling medium, such as chilled water, refrigerant, gas, or other medium is pumped through cooling coils configured with the modules 20.

In the illustrated embodiment of system 10, at least one post-heat module 22 is located immediately downstream of the vapor deposition apparatus 60 and before the cool-down modules 20. The post-heat module 22 maintains a controlled heating profile of the substrate 14 until the entire substrate is moved out of the vapor deposition apparatus 60 to prevent damage to the substrate, such as warping or breaking caused by uncontrolled or drastic thermal stresses. If the leading section of the substrate 14 were allowed to cool at an excessive rate as it exited the apparatus 60, a potentially damaging temperature gradient would be generated longitudinally along the substrate 14. This condition could result in cracking or breaking of the substrate from thermal stress.

As diagrammatically illustrated in FIG. 1, a feed device 24 is configured with the vapor deposition apparatus 60 to supply source material, such as granular CdTe. Preferably, the feed device 24 is configured so as to supply the source material without interrupting the continuous vapor deposition process within the apparatus 60 or conveyance of the substrates 14 through the apparatus 60.

Still referring to FIG. 1, the individual substrates 14 are initially placed onto a load conveyor 26, and are subsequently moved into an entry vacuum lock station that includes a load module 28 and a buffer module 30. A "rough" (initial) vacuum pump 32 is configured with the load module 28 to drawn an initial vacuum, and a "fine" (high) vacuum pump 38 is configured with the buffer module 30 to increase the vacuum in the buffer module 30 to essentially the vacuum within the vacuum chamber 12. Valves 34 (such as gate-type slit valves or rotary-type flapper valves) are operably disposed between the load conveyor 26 and the load module 28, between the load module 28 and the buffer module 30, and between the buffer module 30 and the vacuum chamber 12. These valves 34 are sequentially actuated by a motor or other type of actuating mechanism 36 in order to introduce the substrates 14 into the vacuum chamber 12 in a step-wise manner without affecting the vacuum within the chamber 12.

An exit vacuum lock station is configured downstream of the last cool-down module 20, and operates essentially in reverse of the entry vacuum lock station described above. For example, the exit vacuum lock station may include an exit buffer module 42 and a downstream exit lock module 44. Sequentially operated slide valves 34 are disposed between the buffer module 42 and the last one of the cool-down modules 20, between the buffer module 42 and the exit lock module 44, and between the exit lock module 44 and an exit conveyor 46. A fine vacuum pump 38 is configured with the exit buffer module 42, and a rough vacuum pump 32 is configured with the exit lock module 44. The pumps 32, 38 and slide valves 34 are sequentially operated to move the substrates 14 out of the vacuum chamber 12 in a step-wise fashion without loss of vacuum condition within the vacuum chamber 12.

System 10 also includes a conveyor system configured to move the substrates 14 into, through, and out of the vacuum chamber 12. In the illustrated embodiment, this conveyor system includes a plurality of individually controlled conveyors 48, with each of the various modules including one of the conveyors 48. It should be appreciated that the type or configuration of the conveyors 48 in the various modules may vary. In the illustrated embodiment, the conveyors 48 are roller conveyors having driven rollers that are controlled so as to achieve a desired conveyance rate of the substrates 14 through the respective module and the system 10 overall.

As described, each of the various modules and respective conveyors in the system 10 are independently controlled to perform a particular function. For such control, each of the individual modules may have an associated independent controller 50 configured therewith to control the individual functions of the respective module. The plurality of controllers 50 may, in turn, be in communication with a central system controller 52, as illustrated in FIG. 1. The central system controller 52 can monitor and control (via the independent controllers 50) the functions of any one of the modules so as to achieve an overall desired heat-up rate, deposition rate, cool-down rate, and so forth, in processing of the substrates 14 through the system 10.

Referring to FIG. 1, for independent control of the individual respective conveyors 48, each of the modules may include any manner of active or passive sensor 54 that detects the presence of the substrates 14 as they are conveyed through the module. The sensors 54 are in communication with the respective module controller 50, which is in turn in communication with the central controller 52. In this manner, the individual respective conveyor 48 may be controlled to ensure that a proper spacing between the substrates 14 is maintained and that the substrates 14 are conveyed at the desired constant conveyance rate through the vacuum chamber 12.

The vapor deposition apparatus 60 may take on various configurations and operating principles within the scope and spirit of the invention, and is generally configured for vapor deposition of a sublimated source material, such as CdTe, as a thin film layer on the PV module substrates 14. In the embodiment of the system 10 illustrated in FIG. 1, the apparatus 60 is a module that includes a casing 95 (FIGS. 2 and 3) in which the internal components are contained, including a vacuum deposition head 62 mounted above a conveyor assembly 100 in accordance with aspects of the invention.

FIG. 2 is a diagram view of a vapor deposition apparatus 60 that may incorporate a conveyor assembly 100 in accordance with aspects of the invention. The apparatus 60 includes the vapor deposition head 62 configured above the conveyor assembly 100. The vapor deposition area is defined below the deposition head for sublimating and diffusing a source material, such as CdTe, onto the upper surface of substrates 14 as they are conveyed by the conveyor assembly 100 below the deposition head 62.

The conveyor assembly 100 may include a housing 114 (depicted schematically by dashed lines in FIG. 2) that may be made of any manner of structural elements. The housing 114 fits within the casing 95 of the vapor deposition module 60. A conveyor 102 is operably disposed within the housing 114 and is movable in an endless loop path (depicted by the curved arrows in FIG. 2) within the housing 114. The endless loop of the conveyor 102 includes an upper leg that moves in a conveyance direction to carry the substrates 14 through the deposition area below the deposition head 62. The conveyor moves in an opposite lower leg after the substrates 14 move off of the conveyor 102. As described in greater detail below with reference to FIG. 3, the conveyor 102 is driven in its endless loop by means of sprockets.

A heat source 118 is disposed relative to the housing so as to heat the conveyor 102 at a location along the endless loop path generally after the point where the substrates 14 leave the conveyor 102. For example, in the embodiment illustrated in FIG. 2, a first portion of the heat source 118 may be disposed at the location where the conveyor changes direction from the upper leg to the lower leg. A second portion of the heat source 118 may be disposed along an initial portion of the lower leg of the conveyor path. It is desirable that the heat source components 118 do not heat the conveyor until after the substrates 14 have left the conveyor 102. The substrates 14 should remain relatively "cool" along the upper leg of the conveyor path to ensure even and uniform plating of the sublimated CdTe material thereon. Also, premature heating of the conveyor 102 may also result in damage (e.g., warping) to the substrates 14.

Inevitably, some of the sublimated CdTe material will plate onto the conveyor 102 in the deposition area, particularly along the side edges of the conveyor. Also, the surfaces of the conveyor 102 between adjacent substrates 14 will also be exposed to the sublimated CdTe, which results in the CdTe material plating onto these areas as well. The heat source components 118 are effective to heat the various conveyor components after the substrates 14 leave the conveyor 102 to cause the plated source material to "burn off" or sublimate. This sublimated material can then be collected and reused. In addition, the burning off of the source material from the conveyor components ensures that a clean and smooth surface is presented to incoming substrates 14. Also, by continuously removing the plated source material from the conveyor 102, down-time of the apparatus 60 for cleaning the conveyor components is reduced.

In the embodiment illustrated in FIG. 2, the initial (vertical) "burn-off" components 118 are disposed between the housing 114 and casing 95, and the lower "burn-off" components 118 are inside of the housing 114. This configuration allows for the conveyor 102 to be lifted vertically up and out of the space for repair, maintenance, or replacement. It should be appreciated, however, that the configuration of FIG. 2 is for illustrative purposes only, and that the heat source components

118 may be variously disposed inside and outside of the housing 114. For example, the heat source components 118 may be attached to the inside surfaces of the housing walls 114 directly adjacent to the conveyor 102.

A cold trap 122 is disposed relative to the housing 114 at a location effective for diffusion of sublimated source material thereto. For example, in the illustrated embodiment, the cold trap 122 is located adjacent to the heat source components 118 along the lower leg of the conveyor 102. The cold trap 122 is maintained at a temperature that is effective for causing the sublimated source material within the conveyor assembly 100 generated from heating the conveyor 102 with the heat source components 118 to plate out onto a collection member that is configured with the cold trap 122. The collection member, which may be a tray or other surface (as described in greater detail below with respect to the embodiment of FIG. 3), is removable from the apparatus 60 for subsequent collection of the source material that has plated onto the collection member.

After the cold trap 122 in the direction of movement of the conveyor 102, an additional heat source component 140 is disposed relative to the housing so as to pre-heat the upper surface of the conveyor 102 prior to receipt of incoming substrates 14, as depicted in FIG. 2.

As depicted in FIG. 2, it may be desired to include insulation plates 134 within the conveyor loop path to shield the upper leg of the conveyor 102 from the heat source components 118 and the cold trap 122. The temperature and pressure along the upper leg of the conveyor 102, particularly in the deposition area below the deposition head 62, are carefully maintained and controlled to ensure an even and uniform deposition of a thin film layer of the source material onto the upper surface of the substrates 14. The heat shield plates 134 reduce any undesired thermal affects that may result from the heat source components 118 and cold trap 122 from affecting the vapor deposition process.

Periodically, it is necessary to remove the collection member of the cold trap 122 from the conveyor assembly 100 to collect the plated source material therefrom. A replacement collection member may be substituted for the removed collection member if desired. Referring to FIG. 6, any manner of access door or hatch 136 may be provided in the casing structure 95 of the vapor deposition module 60 to provide access to the collection member component of the cold trap 122. With this configuration, it may be desired to include an exhaust port 138 in the casing structure 95. This port 138 may be connected to an external exhaust system 137 for the purpose of drawing external air into the conveyor assembly housing 114 through the access door 136 when the door is opened for removal of the collection member. This system ensures that any dust or particulate source material is not allowed to escape from the apparatus 60 into the work environment. The external exhaust system 137 that is connected to the exhaust port 138 can filter any air that is drawn through the housing 114. Thus, the collection member removal process does not result in an unsafe or hazardous environment.

FIGS. 4 and 5 illustrate a unique embodiment of a cold trap 122 that may be utilized with the present invention. The cold trap 122 includes a base 124 that may be force-cooled by way of a cooling medium 132 (FIG. 2) being recirculated through cooling coils 126 configured therewith. The cooling medium 132 may be, for example, chill-water, refrigerant, or any other suitable cooling medium. A frame 128 is seated on the base 124 and serves to support a tray 130 (the collection member in this embodiment). The tray 130 is removable from the frame 128 and is maintained at a relatively cool temperature due to its location directly above the cooling coils 126. The tray 130 presents a cooled surface onto which the sublimated source material will plate. The entire frame 128 may be removed through the access door 136 (FIG. 6), at which time the tray 130 can be subsequently processed to remove the plated source material. For example, the tray 130 may be mechanically agitated or deformed to cause the plated source material to flake or otherwise disengage from the tray 130. This collection process would desirably be conducted in a controlled environment to prevent any of the source material from becoming airborne in the work environment.

FIG. 3 depicts an embodiment of a vapor deposition module 60 in accordance with aspects of the invention that is particularly suited for the system 10 of FIG. 1. In this embodiment, the module 60 includes the vacuum deposition head 62 configured above the conveyor assembly 100. The deposition head 62 defines an interior space in which a receptacle 66 is configured for receipt of a granular source material (not shown). As mentioned, the granular source material may be supplied by a feed device or system 24 (FIG. 1) via a feed tube 70. The feed tube 70 is connected to a distributor 72 disposed in an opening in a top wall of the vapor deposition head 62. The distributor 72 includes a plurality of discharge ports that are configured to evenly distribute the granular source material into the receptacle 66.

In the illustrated embodiment, at least one thermocouple 74 is operationally disposed through the top wall of the deposition head 62 to monitor temperature within the head chamber adjacent or in the receptacle 66.

The receptacle 66 has a shape and configuration such that end walls 68 of the receptacle 66 are spaced from end walls 76 of the deposition head 62. The sidewalls of the receptacle 66 lie adjacent to and in close proximity to the sidewalls of the deposition head 62 (not visible in the view of FIG. 2) so that very little clearance exists between the respective sidewalls. With this configuration, sublimated source material will flow out of the receptacle 66 as leading and trailing curtains of vapor 67 over the end walls 68. Very little of the sublimated source material will flow over the sidewalls of the receptacle 66.

A heated distribution manifold 78 is disposed below the receptacle 66, and may have a clam-shell configuration that includes an upper shell member 80 and a lower shell member 82. The mated shell members 80, 82 define cavities in which heater elements 84 are disposed. The heater elements 84 heat the distribution manifold 78 to a degree sufficient for indirectly heating the source material within the receptacle 66 to cause sublimation of the source material. The heat generated by the distribution manifold 78 also aids in preventing the sublimated source material from plating out onto components of the deposition head 62. Additional heater elements 98 may also be disposed within the deposition head 62 for this purpose. Desirably, the coolest component within the deposition head 62 is the upper surface of the substrates 14 conveyed therethrough so that the sublimated source material is ensured to plate primarily on the substrates.

Still referring to FIG. 3, the heated distribution manifold 78 includes a plurality of passages 86 defined therethrough. These passages 86 have a shape and configuration so as to uniformly distribute the sublimated source material towards the underlying substrates 14.

A distribution plate 88 is disposed below the manifold 78 at a defined distance above a horizontal plane of the upper surface of an underlying substrate 14. The distribution plate 88 includes a pattern of holes or passages therethrough that further distribute the sublimated source material passing through the distribution manifold 78.

As previously mentioned, a significant portion of the sublimated source material will flow out of the receptacle 66 as leading and trailing curtains of vapor 67. Although these curtains of vapor will diffuse to some extent in the longitudinal direction prior to passing through the distribution plate 88, it should be appreciated that it is unlikely that a uniform distribution of the sublimated source material in the longitudinal direction will be achieved. In other words, more of the sublimated source material will be distributed through the longitudinal end sections of the distribution plate 88 as compared to the middle portion of the distribution plate. However, as discussed above, because the system 10 conveys the substrates 14 through the vapor deposition apparatus 60 at a non-stop constant linear speed, the upper surfaces of the substrates 14 will be exposed to the same deposition environment regardless of any non-uniformity of the vapor distribution along the longitudinal aspect of the apparatus 60. The passages 86 in the distribution manifold 78 and the holes in the distribution plate 88 ensure a relatively uniform distribution of the sublimated source material in the transverse aspect of the vapor deposition apparatus 60. So long as the uniform transverse aspect of the vapor is maintained, a relatively uniform thin film layer is deposited onto the upper surface of the substrates 14.

As illustrated in FIG. 3, it may be desired to include a debris shield 89 between the receptacle 66 and the distribution manifold 78. This shield 89 includes relatively large holes defined therethrough (as compared to the distribution plate 88 and serves to retain any granular or particulate source material from passing through and potentially interfering with operation of the other components of the deposition head 62.

Still referring to FIG. 3, the deposition head 62 may include transversely extending seals 96 at each longitudinal end thereof. In the illustrated embodiment, the seals 96 are defined by components of the lower shell member 82 of the heated distribution manifold 78. In one embodiment, these seals 96 may be disposed at a distance above the upper surface of the substrates 14 that is less than the distance between the surface of the substrates 14 and the distribution plate 88. The seals 96 help to maintain the sublimated source material in the deposition area above the substrates. In other words, the seals 96 prevent the sublimated source material from "leaking" out through the longitudinal ends of the apparatus 60. It should be appreciated that, in alternative embodiments, the seals 96 may be engaged against opposite structure in the apparatus 60 and serve the same function.

The embodiment of FIG. 3 includes a movable shutter plate 90 disposed above the distribution manifold 78. This shutter plate 90 includes a plurality of passages 94 defined therethrough that align with the passages 86 in the distribution manifold 78 in a first operational position of the shutter plate 90 such that the sublimated source material is free to flow through the shutter plate 90 and through the distribution manifold 78 for subsequent distribution through the plate 88. The shutter plate 90 is movable to a second operational position wherein the passages 94 are misaligned with the passages 86 in the distribution manifold 78. In this configuration, the sublimated source material is blocked from passing through the distribution manifold 78, and is essentially contained within the interior volume of the deposition head 62.

Any suitable actuation mechanism 92 may be configured for moving the shutter plate 90 between the first and second operational positions. In the illustrated embodiment, the actuation mechanism 92 includes a rod 93 and any manner of suitable linkage that connects the rod 93 to the shutter plate 90. The rod 93 is externally rotated by any manner of mechanism located externally of the deposition head 62. The shutter plate 90 is particularly beneficial in that, for whatever reason, the sublimated source material can be quickly and easily contained within the deposition head 62 and prevented from passing through to the deposition area above the substrates 14 or conveyor assembly 100. This may be desired, for example, during start up of the system 10 while the concentration of vapors within the deposition head 62 chamber builds to a sufficient degree to start the deposition process. Likewise, during shutdown of the system, it may be desired to maintain the sublimated source material within the deposition head 62 to prevent the material from plating out on the conveyor or other components of the apparatus 60.

The conveyor assembly 100 in the embodiment of FIG. 3 incorporates various embodiments of the features discussed above with respect to FIG. 2. In this embodiment, the conveyor 102 is defined by a plurality of slats 108 that present a flat, uninterrupted surface for the substrates 14 along the upper leg of the conveyor 102. Tracks 104 are disposed along the upper leg of the conveyor 102 and provide a running surface for conveyor rollers 110.

The conveyor 102 may run in its endless loop path around sprockets 112 that include teeth or cogs that engage with the conveyor rollers 108. At least one of the sprockets 112 is a driven sprocket, while the opposite sprocket is an idler sprocket. Typically, the upstream sprocket 112 is the idler sprocket.

The conveyor slats 108 are interconnected by link assemblies 106, which include link plates 107 that are attached to the individual slats 108. The link plates 107 are interconnected to each other by way of axle pins 109 that also function to connect the rollers 110 to the link assemblies 106.

In the embodiment of FIG. 3, the heat source components 118 are heating elements 120 that are disposed between heat shields 115 and the housing walls 114 along the vertical sides of the housing 114. The bottom heating elements 120 are disposed within the confines of the housing 114. The housing 114, heat shields 115, heater elements 120, and the like, may be supported relative to the casing 95 by any manner of internal support structure 116.

The cold trap 122 in the embodiment of FIG. 3 is essentially supported on the casing 95. The tray 130 is exposed within the space enclosed by the housing 114 of the conveyor assembly 100. The base 124 includes the cooling coils 126, which are supplied by an external cooling medium, as discussed above with respect to the embodiment of FIG. 2.

The present invention also encompasses various process embodiments for reclamation of source material that has plated onto conveyor components in a vapor deposition apparatus. It should be appreciated that the process embodiments may be carried out by any suitable configuration of equipment or components. The process embodiments are not limited to the system embodiments discussed above.

In a particular embodiment, the process includes moving the conveyor in an endless loop path in a vapor deposition apparatus, with the path having an upper leg that moves in a conveyance direction to carry a substrate through a deposition area of the vapor deposition apparatus. At a location in the endless loop path after the position where the substrates leave the conveyor (in a direction of movement of the conveyor), the conveyor is heated to a temperature effective for sublimating source material that may be plated onto the conveyor components. The sublimated source material is collected with a cold trap that is at an effective location along the endless loop path for diffusion of the sublimated source material thereto. For example, the cold trap may be disposed downstream of the location where the conveyor is heated in a direction of movement of the conveyor in the endless loop path before the conveyor returns to its upper leg. The sublimated source material plates onto a collection member configured with the cold trap. The process includes removing the source material that has plated onto this member.

The process may further include post-heating the conveyor to a desired temperature at a location downstream of the cold trap in the direction of movement of the conveyor and prior to the conveyor receiving a substrate along the upper leg of the closed loop path.

The process may further include shielding the upper leg of the endless loop path of the conveyor from the heating process and cold trap process that are conducted along other portions of the endless loop path.

The process for reclamation of the source material from the conveyor components may be carried out during conveyance of substrates through the vapor deposition apparatus for deposition of a thin film of source material thereon. In an alternate embodiment, the process may be carried out during a maintenance procedure wherein the conveyor is moved along the endless loop path through the vapor deposition apparatus without conveying substrates thereon, and in which the sublimation process is isolated from the conveyor by the shutter plate configuration discussed above.

While the present subject matter has been described in detail with respect to specific exemplary embodiments and methods thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A conveyor assembly for use in a vapor deposition apparatus wherein a sublimed source material is deposited as a thin film on a photovoltaic (PV) module substrate, said assembly comprising:
   a conveyor operably disposed within said vapor deposition apparatus, said conveyor movable in an endless loop path having an upper leg that moves in a conveyance direction to carry a substrate through a deposition area of said vapor deposition apparatus;
   a heat source disposed relative to said endless loop path so as to heat said conveyor at a location along said endless loop path generally after a point where the substrate leaves said conveyor, said heat source configured to heat said conveyor to a temperature effective for sublimating source material from said conveyor; and
   a cold trap disposed along said endless loop path and maintainable at a temperature effective for causing sublimated source material generated from heating said conveyor to plate out onto a collection member configured with said cold trap.

2. The conveyor assembly as in claim 1, wherein said conveyor is configured within a housing, said housing removably disposed within said vapor deposition apparatus.

3. The conveyor assembly as in claim 1, further comprising a pre-heater disposed between said cold trap and the location where the substrate is moved onto said conveyor, said pre-heater configured to raise the temperature of said conveyor to a desired temperature prior to said conveyor receiving the substrate.

4. The conveyor assembly as in claim 1, further comprising insulation shielding disposed within said conveyor loop path to shield said upper leg of said conveyor from said heat source and said cold trap.

5. The conveyor assembly as in claim 1, wherein said cold trap comprises a base cooled by a recirculating fluid medium, and said collection member comprises a tray removably configured on said heat sink.

6. The conveyor assembly as in claim 5, further comprising an access door in said vapor deposition apparatus located for removal of said tray from within said vapor deposition apparatus.

7. The conveyor assembly as in claim 6, further comprising an exhaust port in said vapor deposition apparatus configured for communication with an exhaust system to draw external air into said vapor deposition apparatus through said access door when said access door is open for removal of said tray.

8. A vapor deposition apparatus for deposition of a sublimed source material as a thin film on a photovoltaic (PV) module substrate conveyed through said vapor deposition apparatus, comprising:
   a casing;
   a vapor deposition head operably configured within said casing to sublimate a source material;
   a conveyor assembly operably configured within said casing below said vapor deposition head, said conveyor assembly further comprising
   a conveyor movable in an endless loop path having an upper leg that moves in a conveyance direction to carry a substrate through a deposition area of the vapor deposition apparatus;
   a heat source disposed so as to heat said conveyor at a location along said endless loop path generally after where the substrate leaves said conveyor, said heat source configured to heat said conveyor to a temperature effective for sublimating source material from said conveyor; and
   a cold trap disposed at a location along said endless loop path and maintainable at a temperature effective for causing sublimated source material generated from heating said conveyor to plate out onto a collection member configured with said cold trap.

9. The vapor deposition apparatus as in claim 8, further comprising a pre-heater disposed between said cold trap and the location where the substrate is moved onto said conveyor, said pre-heater configured to raise the temperature of said conveyor to a desired temperature prior to said conveyor receiving the substrate.

10. The vapor deposition apparatus as in claim 8, further comprising insulation shielding disposed within said conveyor loop path to shield said upper leg of said conveyor from said heat source and said cold trap.

11. The vapor deposition apparatus as in claim 8, wherein said cold trap comprises a heat sink section cooled by a recirculating fluid medium, and said collection member comprises a tray removably configured on said heat sink.

12. The vapor deposition apparatus as in claim 11, wherein said casing further comprises an access door located for removal of said tray, and further comprising an exhaust port in said casing for communication with an exhaust system to draw external air into said casing through said access door when said access door is open for removal of said tray.

* * * * *